(12) United States Patent
Uchikawa

(10) Patent No.: US 8,758,654 B1
(45) Date of Patent: Jun. 24, 2014

(54) PHOTOSENSITIVE RESIN COMPOSITION FOR COLOR FILTER AND COLOR FILTER USING THE SAME

(71) Applicant: Cheil Industries Inc., Gumi-si (KR)

(72) Inventor: Kiyoshi Uchikawa, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/913,546

(22) Filed: Jun. 10, 2013

(30) Foreign Application Priority Data

Dec. 13, 2012 (KR) .......................... 10-2012-0145121

(51) Int. Cl.
*G02B 5/23* (2006.01)
*G02F 1/1335* (2006.01)
*G03C 1/00* (2006.01)
*G03F 7/00* (2006.01)

(52) U.S. Cl.
USPC ........... 252/586; 252/582; 349/106; 349/107; 430/7; 430/280.1; 430/281.1; 430/285.1; 430/287.1; 430/293

(58) Field of Classification Search
USPC ............... 252/582, 586; 349/106, 107; 430/7, 430/280.1, 281.1, 285.1, 287.1, 293
See application file for complete search history.

(56) References Cited

U.S. PATENT DOCUMENTS

| | | | |
|---|---|---|---|
| 5,278,009 | A | 1/1994 | Iida et al. |
| 5,721,076 | A | 2/1998 | Watanabe et al. |
| 7,759,043 | B2 | 7/2010 | Tanabe et al. |
| 2009/0087759 | A1 | 4/2009 | Matsumoto et al. |
| 2010/0188765 | A1 | 7/2010 | Matsumoto et al. |
| 2012/0091407 | A1* | 4/2012 | Lee et al. ...................... 252/582 |
| 2013/0143158 | A1* | 6/2013 | Lee et al. ................... 430/280.1 |

FOREIGN PATENT DOCUMENTS

| | | | |
|---|---|---|---|
| JP | 60-237403 | A | 11/1985 |
| JP | 01-152449 | A | 6/1989 |
| JP | 01-200353 | A | 8/1989 |
| JP | 04-007373 | A | 1/1992 |
| JP | 04-091173 | A | 3/1992 |
| JP | 04-163552 | A | 6/1992 |
| JP | 2878486 | A | 12/1992 |
| JP | 2006-162784 | A | 6/2006 |
| JP | 2008-179611 | A | 8/2008 |
| JP | 2010-224267 | A | 10/2010 |
| JP | 4914972 | B2 | 4/2012 |
| KR | 1992-0005780 | B1 | 7/1992 |
| KR | 1992-7002502 | | 9/1992 |
| KR | 1994-0005617 | B1 | 6/1994 |
| KR | 1995-7000359 | | 1/1995 |
| KR | 1995-0011163 | B1 | 9/1995 |
| KR | 10-0228293 | B1 | 11/1999 |
| KR | 10-2007-0057652 | A | 6/2007 |
| WO | 91/20006 | A1 | 12/1991 |
| WO | 94/00801 | A1 | 1/1994 |
| WO | 94/14892 | A1 | 7/1994 |
| WO | 2006/018405 | A1 | 2/2006 |
| WO | 2007/062963 | A1 | 6/2007 |
| WO | 2007/071497 | A1 | 6/2007 |

* cited by examiner

*Primary Examiner* — Bijan Ahvazi
(74) *Attorney, Agent, or Firm* — Additon, Higgins, Pendleton & Ashe, P.A.

(57) ABSTRACT

A photosensitive resin composition for a color filter includes (A) a binder resin including a cardo-based resin represented by the following Chemical Formula 1, (B) a photopolymerization initiator represented by the following Chemical Formula 14, (C) a photopolymerizable monomer, (E) a colorant, and (F) a solvent and a color filter using the same. In Chemical Formulae 1 and 14, each substituent is the same as defined in the detailed description

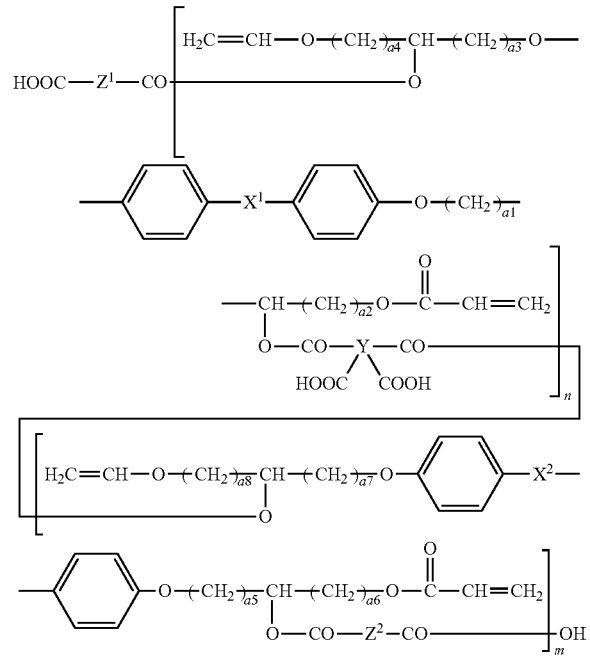

[Chemical Formula 1]

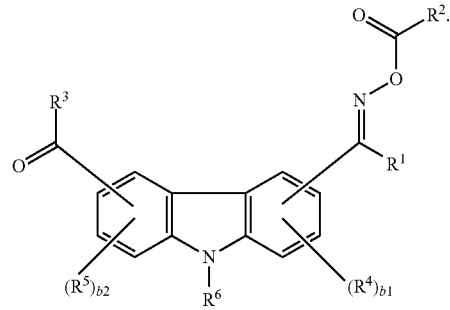

[Chemical Formula 14]

9 Claims, No Drawings

# PHOTOSENSITIVE RESIN COMPOSITION FOR COLOR FILTER AND COLOR FILTER USING THE SAME

CROSS-REFERENCE TO RELATED APPLICATION

This application claims priority to and the benefit of Korean Patent Application No. 10-2012-0145121 filed in the Korean Intellectual Property Office on Dec. 13, 2012, the entire disclosure of which is incorporated herein by reference.

FIELD

This disclosure relates to a photosensitive resin composition for a color filter and a color filter using the same.

BACKGROUND

A liquid crystal display device includes a lower substrate including a light blocking layer, a color filter including a light blocking layer, and an ITO pixel electrode; an active circuit portion including a liquid crystal layer, a thin film transistor, and a capacitor layer; and an upper substrate including an ITO pixel electrode.

The light blocking layer blocks uncontrolled light transmitted out of a transparent pixel electrode of a substrate and thus prevents contrast reduction due to light transmitted through a thin film transistor. Red, green and blue colored layers transmit light with predetermined wavelengths of white light and display colors.

The light blocking layer is generally manufactured by a pigment dispersion method. The pigment dispersion method includes coating a transparent substrate with a colorant-containing photopolymerizable composition, exposing the coating to provide a pattern by thermal curing, and removing non-exposed portions with a solvent.

However, when a photosensitive polyimide or phenol-based resin is used in the pigment dispersion method as a binder resin, high heat resistance may be obtained but sensitivity is lowered and an organic solvent is required as a development solvent. A photoresist using an azide compound has low sensitivity and heat resistance and may be affected by oxygen during exposure.

Also, an acrylic-based resin can have good heat resistance, shrinkage-resistance, chemical resistance, and the like, but reduced sensitivity, developability, and close contacting (adhesion) properties. Since black pigments are included in a large amount in order to adjust optical density of a light blocking layer, sensitivity, developability, and close contacting properties may be significantly deteriorated.

SUMMARY

One embodiment provides a photosensitive resin composition for a color filter that can have improved sensitivity due to pattern peeling capability and pattern-forming capability and also can have excellent heat resistance and chemical resistance.

Another embodiment provides a color filter manufactured using the photosensitive resin composition for a color filter.

According to one embodiment, a photosensitive resin composition for a color filter includes (A) a binder resin including a cardo-based resin represented by the following Chemical Formula 1; (B) a photopolymerization initiator represented by the following Chemical Formula 14; (C) a photopolymerizable monomer; (E) a colorant; and (F) a solvent.

[Chemical Formula 1]

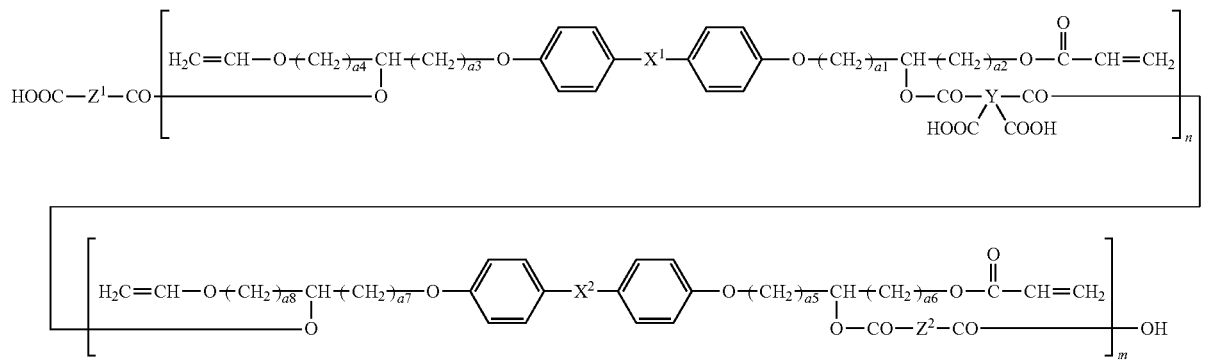

In Chemical Formula 1, $X^1$ and $X^2$ are the same or different and are each independently a single bond, substituted or unsubstituted C1 to C10 alkylene, —O—, —CO—, —COO—, —SO$_2$—, or a linking group selected from the following Chemical Formulae 2 to 13, Y is an acid dianhydride residual group, $Z^1$ and $Z^2$ are the same or different and are each independently an acid anhydride residual group, $a^1$ to $a^8$ are the same or different and are each independently integers ranging from 0 to 10, and n is an integer ranging from 0 to 20, m is 0 or 1, and $n+m \geq 1$.

[Chemical Formula 2]

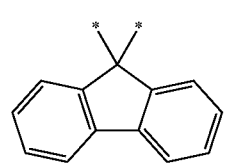

[Chemical Formula 3]

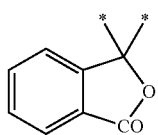

[Chemical Formula 4]

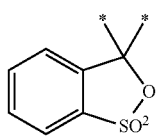

[Chemical Formula 5]

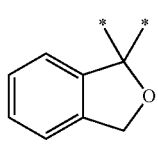

[Chemical Formula 6]

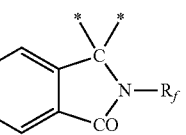

[Chemical Formula 7]

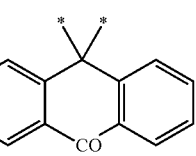

[Cheemical Formula 8]

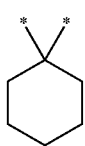

[Chemical Formula 9]

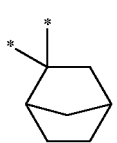

[Chemical Formula 10]

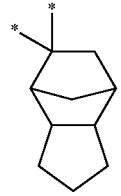

[Chemical Formula 11]

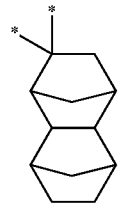

[Chemical Formula 12]

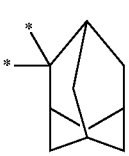

[Chemical Formula 13]

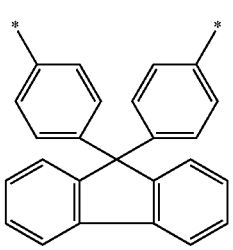

In Chemical Formula 6,
$R_f$ is hydrogen, ethyl, —$C_2H_4Cl$, —$C_2H_4OH$, —$CH_2CH=CH_2$, or phenyl.

[Chemical Formula 14]

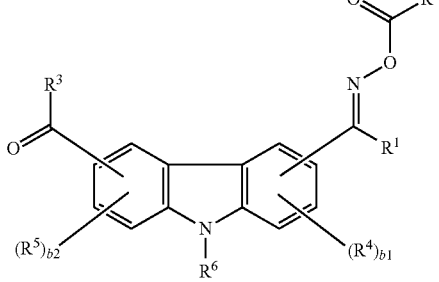

In Chemical Formula 14,
$R^1$ is substituted or unsubstituted C6 to C30 aryl, substituted or unsubstituted C6 to C30 oxyaryl, substituted or unsubstituted C1 to C20 alkyl, substituted or unsubstituted C1 to C20 oxyalkyl, substituted or unsubstituted C1 to C30 alkylaryl, or substituted or unsubstituted C1 to C30 arylalkyl, $R^2$, $R^4$, $R^5$ and $R^6$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $R^3$ is substituted or unsubstituted C6 to C30 aryl, substituted or unsubstituted C2 to C30 heteroaryl, substituted or unsubstituted C2 to C20 heterocycloalkyl, substituted or unsubstituted C2 to C20 heterocycloalkenyl, or substituted or unsubstituted C2 to C20 heterocycloalkynyl, and $b^1$ and $b^2$ are the same or different and are each independently integers ranging from 0 to 3.

In Chemical Formula 14, $R^1$ may be substituted or unsubstituted C6 to C30 oxyaryl, or substituted or unsubstituted C1 to C20 oxyalkyl.

In Chemical Formula 14, $R^3$ may be substituted or unsubstituted C6 to C12 aryl or substituted or unsubstituted C2 to C5 heteroaryl.

The photosensitive resin composition may include the binder resin in an amount of about 5 to about 50 wt % based on the total amount (weight) of the photosensitive resin composition for a color filter.

The photosensitive resin composition may include the photopolymerization initiator in an amount of about 0.1 to about 10 wt % based on the total amount (weight) of the photosensitive resin composition for a color filter.

The colorant may include a dye, a pigment, or a combination thereof.

The pigment may include an organic pigment, an inorganic pigment, or a combination thereof, the organic pigment may include a black organic pigment, and the inorganic pigment may include carbon black, chromium oxide, iron oxide, titan black, titanium carbide, aniline black, or a combination thereof.

The photosensitive resin composition for a color filter may include about 5 to about 50 wt % of the binder resin (A); about 0.1 to about 10 wt % of the photopolymerization initiator (B); about 1 to about 50 wt % of the photopolymerizable monomer (C); about 1 to about 50 wt % of the colorant (D); and a balance amount of the solvent (E).

According to another embodiment, a color filter manufactured using the photosensitive resin composition for a color filter is provided.

Hereinafter, other embodiments will be described in detail.

The photosensitive resin composition for a color filter may provide a color filter having improved sensitivity due to pattern peeling capability and pattern-forming capability and may also have excellent heat resistance and chemical resistance.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with a substituent including halogen (F, Cl, Br or I), a hydroxyl group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C30 heteroaryl group, or a combination thereof, instead of at least one hydrogen.

As used herein, when a specific definition is not otherwise provided, the term "hetero" may refer to one including at least one heteroatom including N, O, S, P or a combination thereof in place of a carbon atom of a cyclic group.

As used herein, when specific definition is not otherwise provided, "(meth)acrylate" refers to both "acrylate" and "methacrylate", and "(meth)acrylic acid" refers to both "acrylic acid" and "methacrylic acid".

The photosensitive resin composition for a color filter according to one embodiment includes (A) a binder resin, (B) a photopolymerization initiator, (C) a photopolymerizable monomer, (D) a colorant and (E) a solvent.

Hereinafter, each component is described in detail.

(A) Binder Resin

The binder resin may be a cardo-based resin represented by the following Chemical Formula 1.

[Chemical Formula 1]

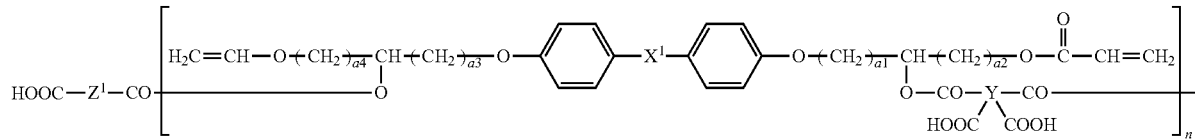

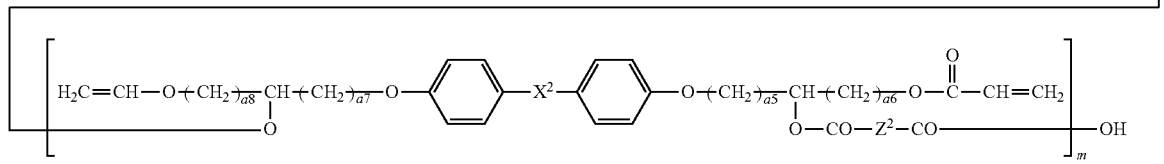

In Chemical Formula 1, $X^1$ and $X^2$ are the same or different and are each independently a single bond, substituted or unsubstituted C1 to C10 alkylene, —O—, —CO—, —COO—, —SO$_2$—, or a linking group selected from the following Chemical Formulae 2 to 13.

[Chemical Formula 2]

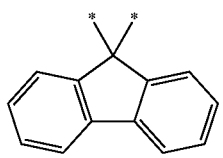

[Chemical Formula 3]

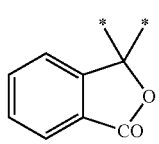

[Chemical Formula 4]

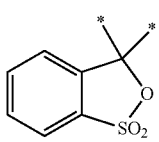

[Chemical Formula 5]

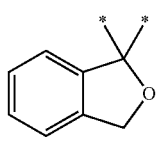

[Chemical Formula 6]

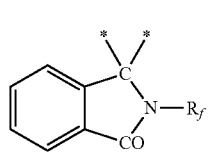

[Chemical Formula 7]

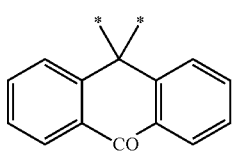

[Chemical Formula 8]

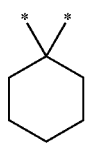

[Chemical Formula 9]

[Chemical Formula 10]

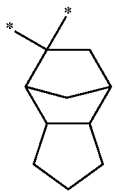

[Chemical Formula 11]

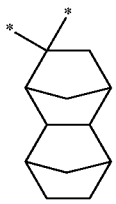

[Chemical Formula 12]

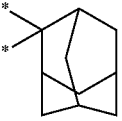

[Chemical Formula 13]

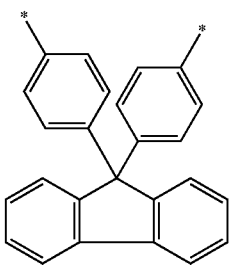

In Chemical Formula 6, $R_f$ is hydrogen, ethyl, —C$_2$H$_4$Cl, —C$_2$H$_4$OH, —CH$_2$CH=CH$_2$, or phenyl.

The cardo-based resin may improve heat resistance, chemical resistance, and a close contacting (adhesion) property of the photosensitive resin composition for a color filter.

In Chemical Formula 1, Y may be an acid dianhydride residual group.

In Chemical Formula 1, $Z^1$ and $Z^2$ are the same or different and are each independently an acid anhydride residual group.

In Chemical Formula 1, $a^1$ to $a^8$ are the same or different and are each independently integers ranging from 0 to 10.

In Chemical Formula 1, n is an integer ranging from 0 to 20, for example 4 to 7, m is 0 or 1, and n+m≥1.

The cardo-based resin may have a weight average molecular weight of about 1,000 to about 20,000 g/mol, for example about 2,000 to about 8,000 g/mol. When the cardo-based resin has a weight average molecular weight within the above range, excellent patterning capability and developability may be provided during manufacture of a color filter.

The binder resin may include an acrylic-based resin as well as the cardo-based resin.

The acrylic-based resin can be a copolymer of a first ethylenic unsaturated monomer and a second ethylenic unsaturated monomer that is copolymerizable with the first ethylenic unsaturated monomer, and a resin including at least one acrylic-based repeating unit.

The first ethylenic unsaturated monomer is an ethylenic unsaturated monomer including at least one carboxyl group. Examples of the monomer include without limitation acrylic acid, methacrylic acid, maleic acid, itaconic acid, fumaric acid, and the like, and combinations thereof.

The acrylic-based resin can include the first ethylenic unsaturated monomer in an amount ranging from about 5 to about 50 wt %, for example, from about 10 to about 40 wt %, based on the total amount (weight) of the acrylic-based resin. In some embodiments, the acrylic-based resin can include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl (meth)acrylate, and the like; carboxylic acid vinyl ester compounds such as vinyl acetate, vinyl benzoate, and the like; unsaturated carboxylic acid glycidyl ester compounds such as glycidyl(meth)acrylate and the like; vinyl cyanide compounds such as (meth)acrylonitrile and the like; unsaturated amide compounds such as (meth)acrylamide and the like; and the like. These may be used singularly or as a mixture of two or more.

Examples of the acrylic-based resin may include without limitation a methacrylic acid/benzylmethacrylate copolymer, a methacrylic acid/benzylmethacrylate/styrene copolymer, a methacrylic acid/benzyl methacrylate/2-hydroxyethylmethacrylate copolymer, a methacrylic acid/benzyl methacrylate/styrene/2-hydroxyethylmethacrylate copolymer, and the like. These may be used singularly or as a mixture of two or more.

The acrylic-based resin may have a weight average molecular weight ranging from 3,000 to 150,000 g/mol, for example 5,000 to 50,000 g/mol, and as another example 2,000 to 30,000 g/mol. When the acrylic-based resin has a weight average molecular weight within the above range, the photosensitive resin composition for a color filter can have good physical and chemical properties, appropriate viscosity, and close contacting (adhesion) properties with a substrate during manufacture of a color filter.

The acrylic-based resin may have an acid value of about 15 to about 200 mgKOH/g, for example about 50 to about 150 mgKOH/g. When the acrylic-based resin has an acid value within the above range, excellent pixel resolution may be realized.

The photosensitive resin composition may include the binder resin in an amount of about 5 to about 50 wt %, for example about 10 to about 30 wt % based on the total amount (weight) of the photosensitive resin composition for a color filter. In some embodiments, the photosensitive resin composition may include the binder resin in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 49, or 50 wt %. Further, according to some embodiments of the present invention, the amount of the binder resin can be in a range from about any of the foregoing amounts to about any other of the foregoing amounts.

When the binder resin is included in an amount within the above range, patterning capability, processibility, and developability can be improved during manufacture of the color filter due to appropriate viscosity.

(B) Photopolymerization Initiator

The photopolymerization initiator produces radicals upon exposure and causes photopolymerization during a pattern-forming process in the photosensitive resin composition for a color filter.

The photopolymerization initiator may be a compound represented by the following Chemical Formula 14. When the compound represented by the following Chemical Formula 14 is used as a photopolymerization initiator with the cardo-based resin, photocuring can be performed to provide sensitivity against a black resist having high light blocking properties.

[Chemical Formula 14]

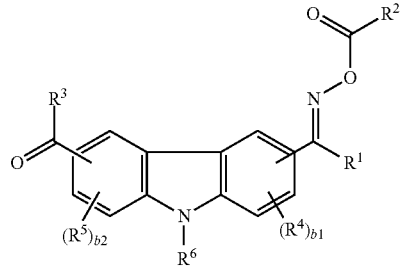

In Chemical Formula 14, $R^1$ is substituted or unsubstituted C6 to C30 aryl, substituted or unsubstituted C6 to C30 oxyaryl, substituted or unsubstituted C1 to C20 alkyl, substituted or unsubstituted C1 to C20 oxyalkyl, substituted or unsubstituted C1 to C30 alkylaryl, or substituted or unsubstituted C1 to C30 arylalkyl. In exemplary embodiments, $R^1$ may be substituted or unsubstituted C6 to C30 oxyaryl or substituted or unsubstituted C1 to C20 oxyalkyl.

In Chemical Formula 14, $R^2$, $R^4$, $R^5$ and $R^6$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl.

In Chemical Formula 14, $R^3$ is substituted or unsubstituted C6 to C30 aryl, substituted or unsubstituted C2 to C30 heteroaryl, substituted or unsubstituted C2 to C20 heterocycloalkyl, substituted or unsubstituted C2 to C20 heterocycloalkenyl, or substituted or unsubstituted C2 to C20 heterocycloalkynyl. In exemplary embodiments, $R^3$ may be substituted or unsubstituted C6 to C12 aryl or substituted or unsubstituted C2 to C5 heteroaryl.

In Chemical Formula 14, $b^1$ and $b^2$ are the same or different and are each independently integers of 0 to 3.

The photopolymerization initiator may include at least one of the compounds represented by the following Chemical Formulae 15 and 16, or a combination thereof.

[Chemical Formula 15]

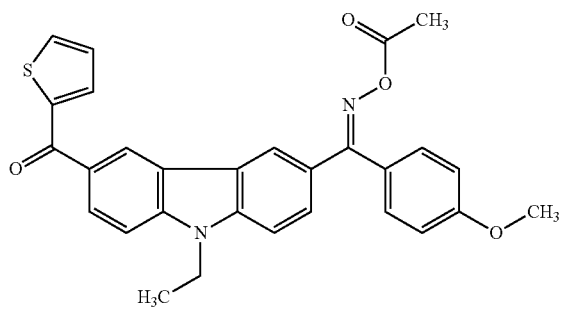

[Chemical Formula 16]

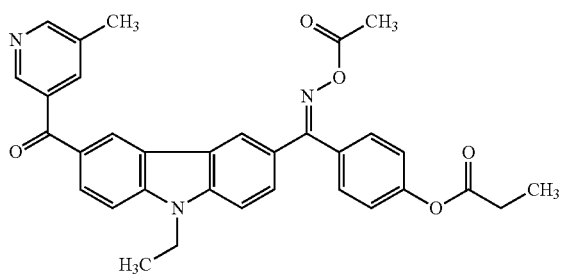

The photosensitive resin composition may include the photopolymerization initiator in an amount of about 0.1 to about 10 wt %, for example about 0.5 to about 7 wt %, based on the total amount (weight) of the photosensitive resin composition for a color filter. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photopolymerization initiator is included in an amount within the above range, sufficient photopolymerization can be performed at exposure during pattern forming process, and decrease of transmittance due to non-reacting initiators may be prohibited.

(C) Photopolymerizable Monomer

The photopolymerizable monomer is a compound that is photopolymerized by the photopolymerization initiator.

The photopolymerizable monomer may be a mono-functional and/or multi-functional ester of (meth)acrylic acid including at least one ethylenic unsaturated double bond.

The photopolymerizable monomer causes sufficient polymerization at exposure during pattern forming processes to form patterns that can have excellent heat resistance, light resistance, and chemical resistance, due to the ethylenic unsaturated double bond.

Examples of the photopolymerizable monomer may include without limitation ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenolA di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenolA epoxy(meth)acrylate, ethylene glycol monomethylether (meth)acrylate, trimethylol propane tri(meth)acrylate, tris(meth)acryloyloxyethyl phosphate, novolacepoxy(meth)acrylate, and the like, and combinations thereof.

Commercially available examples of the photopolymerizable monomer are as follows. The mono-functional (meth)acrylic acid ester may include without limitation Aronix M-101®, M-111®, M-114® (TOAGOSEI CHEMICAL INDUSTRY CO., LTD.); KAYARAD TC-110S®, TC-120S® (NIPPON KAYAKU CO., LTD.); V-158®, V-2311® (OSAKA ORGANIC CHEMICAL IND., LTD.), and the like. Examples of a difunctional (meth)acrylic acid ester may include without limitation Aronix M-210®, M-240®, M-6200® (TOAGOSEI CHEMICAL INDUSTRY CO., LTD.), KAYARAD HDDA®, HX-220®, R-604® (NIPPON KAYAKU CO., LTD.), V-260®, V-312®, V-335 HP® (OSAKA ORGANIC CHEMICAL IND., LTD.), and the like. Examples of a tri-functional (meth)acrylic acid ester may include without limitation Aronix M-309®, M-400®, M-405®, M-450®, M-7100®, M-8030®, M-8060® (TOAGOSEI CHEMICAL INDUSTRY CO., LTD.), KAYARAD TMPTA®, DPCA-20®, DPCA-30®, DPCA-60®, DPCA-120® (NIPPON KAYAKU CO., LTD.), V-295®, V-300®, V-360®, V-GPT®, V-3PA®, V-400® (Osaka Yuki Kayaku Kogyo Co. Ltd.), and the like. The photopolymerizable monomer may be used singularly or as a mixture of two or more.

The photopolymerizable monomer may be treated with acid anhydride to improve developability.

The photosensitive resin composition may include the photopolymerizable monomer in an amount ranging from about 1 to about 50 wt %, for example about 5 to about 30 wt %, based on the total amount (weight) of the photosensitive resin composition for a color filter. In some embodiments, the photosensitive resin composition may include the photopolymerizable monomer in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 49, or 50 wt %. Further, according to some embodiments of the present invention, the amount of the photopolymerizable monomer can be in a range from about any of the foregoing amounts to about any other of the foregoing amounts.

When the photopolymerizable monomer is included in an amount within the above range, curing at exposure during pattern forming processes can be sufficiently performed, and thus sensitivity under oxygen and compatibility with the binder resin can be improved.

(D) Colorant

The colorant may include a pigment, a dye, or a combination thereof.

The pigment may include an organic pigment, an inorganic pigment, or a combination thereof. In order to realize high optical density, a mixture of the organic pigment and inorganic pigment may be used.

The organic pigment may be a black organic pigment. The black organic pigment may have insulating properties.

Examples of the black organic pigment may include without limitation perylene black, cyanine black, and the like, which may be used singularly or as a mixture of two or more.

The black organic pigment may be a mixture of two or more kinds of organic pigments to show a black color. Combinations of any pigment showing a black color by mixing in a color coordinate pigment may be used, and for example blackening combinations of at least two selected from a red pigment, a blue pigment, a green pigment, a violet-based pigment, a yellow-based pigment, a cyanine-based pigment, and a magenta-based pigment may be used. For example, a blackening mixture of a red pigment, a blue pigment, and a green pigment may be used, or a blackening mixture of a green pigment and a violet-based pigment may be used.

Examples of the red pigment may include without limitation perylene-based pigments, anthraquinone-based pigments, dianthraquinone-based pigments, azo-based pigments, diazo-based pigments, quinacridone-based pigments, anthracene-based pigments, and the like, and combinations thereof. In exemplary embodiments, examples of the red pigment may include without limitation perylene pigments, quinacridone pigments, naphthol AS, sicomin pigments, anthraquinones (sudan I, II, III, R), dianthraquinonylates, bis azos, benzopyranes, and the like, and combinations thereof.

Examples of the blue pigment may include without limitation metal phthalocyanine-based pigments, indanthrone-based pigments, indophenol-based pigments, and the like, and combinations thereof. In exemplary embodiments, examples of the blue pigment may include without limitation phthalocyanine metal complexes such as copper phthalocyanine, chloro copper phthalocyanine, chloro aluminum phthalocyanine, titanyl phthalocyanine, vanadic acid phthalocyanine, magnesium phthalocyanine, zinc phthalocyanine, iron phthalocyanine, cobalt phthalocyanine, and the like, and combinations thereof.

Examples of the green pigment may include without limitation halogenated phthalocyanine-based pigments, and the like, and combinations thereof. In exemplary embodiments, examples of the green pigment may include without limitation polychloro copper phthalocyanine, polychloro bromo phthalocyanine, and the like, and combinations thereof.

Examples of the violet-based pigment may include without limitation dioxazine violet, first violet B, methyl violet, indanthrene brilliant violet, and the like, and combinations thereof.

Examples of the yellow-based pigment may include without limitation tetrachloro isoindolinone-based pigments, hansa-based pigments, benzidine yellow-based pigments, azo-based pigments, and the like, and combinations thereof. In exemplary embodiments, examples of the yellow-based pigment may include without limitation hansa yellow (10G, 5G, 3G, G, GR, A, RN, R), benzidine (G, GR), chrome yellow, permanent yellow (FGL, H10G, HR), anthracene, and the like, and combinations thereof.

Examples of the cyanine-based pigment may include without imitation non-metal phthalocyanines, merocyanines, and the like, and combinations thereof.

Examples of the magenta-based pigment may include without limitation dimethyl quinacridone, thio indigo, and the like, and combinations thereof.

Examples of the inorganic pigment may include without limitation carbon black, chromium oxide, iron oxide, titan black, titanium carbide, aniline black, and the like, and combinations thereof. Such an inorganic pigment can have high resistance characteristics, and may be used singularly or in a mixture of two or more kinds.

The organic pigment and inorganic pigment may be mixed in a weight ratio of about 1:1 to about 10:1, for example about 2:1 to about 7:1. Within the weight ratio range, processibility may be stable, and a low dielectric constant may be provided.

The photosensitive resin composition for a color filter may further include a dispersing agent in order to improve dispersion of the pigment.

For example, the pigment may be surface-pretreated with a dispersing agent, or the pigment and dispersing agent may be added together during preparation of the photosensitive resin composition for a color filter.

Examples of the dye may include without limitation triphenylmethane-based dyes, anthraquinone-based dyes, azo-based dyes, and the like, and combinations thereof. In exemplary embodiments, a mixture of the triphenylmethane-based dye and at least one of the anthraquinone-based and azo-based dye may be used.

The photosensitive resin composition may include the colorant in an amount of about 1 to about 50 wt %, for example about 1 to about 40 wt %, based on the total amount (weight) of the photosensitive resin composition for a color filter. In some embodiments, the photosensitive resin composition may include the colorant in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 49, or 50 wt %. Further, according to some embodiments of the present invention, the amount of the colorant can be in a range from about any of the foregoing amounts to about any other of the foregoing amounts.

When the colorant is included in an amount within the above range, insulating properties may be improved, and high optical density, and improved processibility such as developability, and the like may be provided.

(E) Solvent

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol methylether, ethylene glycol dimethylether, ethylene glycol ethylether, propylene glycol monomethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl ester such as ethyl acetate, n-butyl acetate, isobutyl acetate, and the like; lactate alkyl esters such as methyl lactate, ethyl lactate, and the like; alkyl hydroxy acetate ester such as methyl hydroxyacetate, ethyl hydroxyacetate, butyl hydroxyacetate, and the like; alkoxyalkyl acetate esters such as methoxymethyl acetate, methoxyethyl acetate, methoxybutyl acetate, ethoxymethyl acetate, ethoxyethyl acetate, and the like; alkyl 3-hydroxypropionate ester such as methyl 3-hydroxypropionate, ethyl 3-hydroxypropionate, and the like; alkyl 3-alkoxypropionate esters such as methyl 3-methoxypropionate, ethyl 3-methoxypropionate, ethyl 3-ethoxypropionate, methyl 3-ethoxypropionate, and the like; alkyl 2-hydroxypropionate ester such as methyl 2-hydroxypropionate, ethyl 2-hydroxypropionate, propyl 2-hydroxypropionate, and the like; alkyl 2-alkoxypropionate ester such as methyl 2-methoxypropionate, ethyl 2-methoxypropionate, ethyl 2-ethoxypropionate, methyl 2-ethoxypropionate, and the like; alkyl 2-hydroxy-2-methylpropionate esters such as methyl 2-hydroxy-2-methylpropionate, ethyl 2-hydroxy-2-methylpropionate, and the like; alkyl 2-alkoxy-2-methylpropionate esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; ketonate esters such as ethyl pyruvate, and the like, and the like, and combinations thereof. Additionally, the following solvents may be also used: N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like, and combinations thereof. These solvents may be used singularly or as a mixture of two or more.

Taking into account miscibility and reactivity, glycol ethers such as ethylene glycol monoethylether, ethylene glycol dimethylether, and the like; ethylene glycol alkylether acetates such as ethyl cellosolve acetate, and the like; esters such as 2-hydroxy ethyl propionate, and the like; diethylene glycols such as diethylene glycol monomethylether, and the like; propylene glycol alkylether acetates such as propylene glycol methylether acetate, propylene glycol propylether acetate, and the like, and combinations thereof may be used.

The photosensitive resin composition may include the solvent in a balance amount, for example about 50 to about 70 wt %, based on the total amount (weight) of the photosensitive resin composition for a color filter. In some embodiments, the photosensitive resin composition may include the solvent in an amount of about 50, 51, 52, 53, 54, 55, 56, 57, 58, 59, 60, 61, 62, 63, 64, 65, 66, 67, 68, 69, or 70 wt %. Further, according to some embodiments of the present invention, the amount of the solvent can be in a range from about any of the foregoing amounts to about any other of the foregoing amounts.

When the solvent is included in an amount within the above range, the photosensitive resin composition for a color filter may have an appropriate viscosity resulting in improvement of processibility.

(F) Other Additive(s)

The photosensitive resin composition for a color filter may further include one or more other additives. Examples of the additives include without limitation malonic acid; 3-amino-1,2-propanediol; silane-based coupling agents including a vinyl group or a (meth)acryloxy group; leveling agents; fluorine-based surfactants; radical polymerization initiators, and the like, and combinations thereof. The additives can help prevent stains or spots during the coating, adjust leveling, and/or prevent pattern residue due to non-development.

Examples of the silane-based coupling agent may include without limitation trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl)ethyltrimethoxysilane, and the like. They may be used singularly or as a mixture of two or more.

Examples of the fluorine-based surfactant may include without limitation commercial products, for example BM-1000®, and BM-1100® (BM Chemie Inc.); MEGA-FACE F 142D®, F 172®, F 173®, and F 183® DAINIPPON INK KAGAKU KOGYO CO., LTD.); FULORAD FC-135®, FULORAD FC-170C®, FULORAD FC-430®, and FULORAD FC-431® (SUMITOMO 3M CO., LTD.); SURFLON S-112®, SURFLON S-113®, SURFLON S-131®, SURFLON S-141®, and SURFLON S-145® (ASAHI GLASS CO., LTD.); and SH-28PA®, SH-190®, SH-193®, SZ-6032®, and SF-8428®, and the like (TORAY SILICONE CO., LTD.), and the like, and combinations thereof.

The amount of the additive(s) may be easily adjusted depending on desired properties.

According to another embodiment, a color filter manufactured using the photosensitive resin composition for a color filter is provided.

The color filter may be manufactured as follows.

(1) Coating and Film Formation

The photosensitive resin composition for a color filter can be coated to have a desired thickness, for example, a thickness ranging from about 0.5 to about 25 μm, on a substrate which undergoes a predetermined pretreatment, using a spin or slit coating method, a roll coating method, a screen-printing method, an applicator method, and the like. Then, the coated substrate can be heated at a temperature ranging from about 70 to about 110° C. for about 1 to about 10 minutes to remove a solvent.

(2) Exposure

The resultant film can be radiated by an active ray of about 190 to about 500 nm after putting a mask with a predetermined shape to form a desired pattern. The radiation can be performed by using a light source such as a mercury lamp with a low pressure, a high pressure, or an ultrahigh pressure, a metal halide lamp, an argon gas laser, and the like. An X ray, an electron beam, and the like may be also used.

The exposure process can use, for example, a light dose of about 500 mJ/cm2 or less (with a about 365 nm sensor) when a high pressure mercury lamp is used. However, the light dose may vary depending on kinds of each component of the photosensitive resin composition, its combination ratio, and a dry film thickness and can be readily determined by the skilled artisan without undue experimentation.

(3) Development

After the exposure process, an alkali aqueous solution can be used to develop the exposed film by dissolving and removing an unnecessary part except the exposed part, forming an image pattern.

(4) Post-Treatment

The developed image pattern may be heated again or radiated by an active ray and the like for curing, in order to accomplish excellent quality in terms of heat resistance, photo resistance, close contacting properties, crack-resistance, chemical resistance, high strength, storage stability, and the like.

Therefore, the photosensitive resin composition for a color filter may exhibit excellent close contacting (adhesive) property and optical density required for a light blocking layer.

Hereinafter, the present invention is illustrated in more detail with reference to examples. However, they are exemplary embodiments, and the present invention is not limited thereto.

Preparation of Binder Resin

Preparation Example 1

462 g of a bisphenol fluorene epoxy resin (an epoxy equivalent of 231 g/eq), 900 mg of triethyl benzyl ammonium chloride, 200 mg of 2,6-diisobutyl phenyl, and 144 g of acrylic acid are put in a 1000 ml four-necked flask and heated up to 90 to 100° C., while the air is injected thereinto at a speed of 25 ml/min. The slightly opaque solution is slowly heated up to 120° C., leading to its complete dissolution. Next, the acid value of the solution is measured and then the solution is continuously heated and agitated until the acid value reaches less than 2.0 mgKOH/g (8 hours to reach 0.8 mgKOH/g). Then, the solution is cooled to room temperature, obtaining a transparent and colorless solid of bisphenol fluorene epoxy acrylate. Next, propylene glycol monomethylether acetate is added to 152 g of the bisphenol fluorene epoxy acrylate and dissolved therein, and 19 g of 1,2,3,6-tetrahydro anhydrousphthalic acid, 36.8 g of biphenyltetracarboxylic acid dianhydride, and 0.5 g of bromotetraethylammonium are added thereto and mixed together. The mixture is slowly heated up to 110 to 115° C. and reacted for two hours, preparing a cardo-based resin represented by the following Chemical Formula 17.

[Chemical Formula 2]

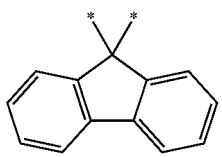

[Chemical Formula 18]

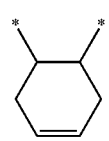

[Chemical Formula 17]

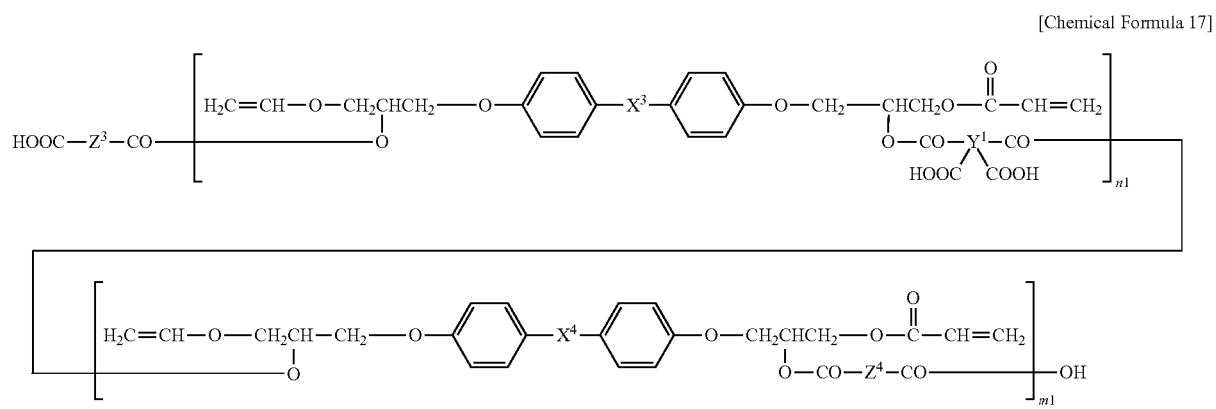

In Chemical Formula 17, $X^3$ and $X^4$ are independently a linking group represented by the following Chemical Formula 2, $Y^1$ is a biphenyl group, $Z^3$ and $Z^4$ are independently a linking group represented by the following Chemical Formula 18, $n^1>0$ and $m^1>0$.

The cardo-based resin represented by the Chemical Formula 17 has a weight average molecular weight of 4,500 g/mol and a solid acid value of 98 mgKOH/g.

Preparation Example 2

A cardo-based resin represented by the following Chemical Formula 19 is prepared according to the same method as Preparation Example 1 except for using benzophenonetetracarboxylic acid dianhydride instead of biphenyltetracarboxylic acid dianhydride in Preparation Example 1.

[Chemical Formula 19]

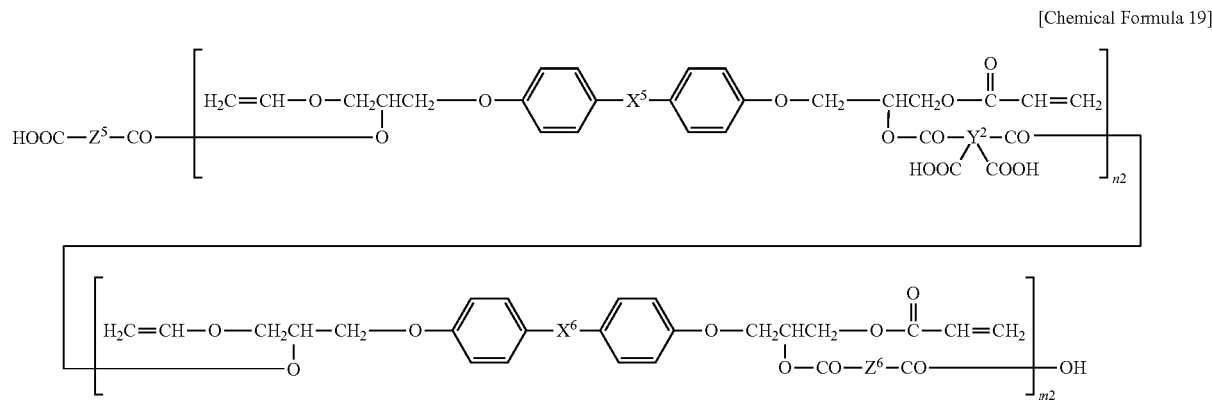

In Chemical Formula 19, $X^5$ and $X^6$ are independently a linking group represented by the following Chemical Formula 2, $Y^2$ is a benzophenone group, $Z^5$ and $Z^6$ are independently a linking group represented by the following Chemical Formula 18, $n^2>0$ and $m^2>0$.

The cardo-based resin represented by the Chemical Formula 19 has a weight average molecular weight of 4,700 g/mol and a solid acid value of 95 mgKOH/g.

Preparation of Photopolymerization Initiator

Preparation Example 3

5 g (25.61 mmol) of ethyl carbazole and 4.32 g (26.89 mmol) of 2-thiopheneacetylchloride are dissolved in 30 ml of dichloromethane. The solution is cooled down to 2° C. in an ice bath and then agitated, and 3.41 g (25.61 mmol) of $AlCl_3$ is added thereto. The resulting mixture is further agitated at room temperature for 3 hours. 4.58 g (26.89 mmol) of p-methoxybenzoic acid chloride is added to 20 ml dichloromethane solution and 4.1 g (30.73 mmol) of $AlCl_3$ is added and then further agitated for 1 hour and 30 minutes. The resultant reaction solution is cooled down in 200 ml of ice, 200 ml of dichloromethane is added thereto, and then, an organic layer is separated therefrom. The obtained organic layer is dried with magnesium sulfate to evaporate a solvent therein, obtaining 10 g of a white solid.

The white solid is mixed with 1.4 g (3.59 mmol) of diketone, 0.261 g (3.76 mmol) of $NH_2OH.HCl$, and 0.32 g (3.9 mmol) of sodium acetate in 15 ml of isopropanol, and the mixture is refluxed for 3 hours. Then, a solvent in the resultant is evaporated, and 30 ml of ethyl acetate is added thereto. The produced solid is cleaned with 30 ml of saturated saline water and then, dried with magnesium sulfate, obtaining 1.82 g of a solid. The solid is purified through carboxyl group column chromatography, obtaining 1.09 g of crystal.

The crystal along with 1.09 g (2.67 mmol) of oxime and 1.04 g (13.4 mmol) of acetyl chloride is dissolved in 20 g of dichloromethane. The solution is cooled down, and 1.35 g (13.4 mmol) of triethylamine is added thereto. The mixture is further reacted at room temperature for four hours. Then, thin layer chromatography is performed to check element loss of the reactant, and then, water and 30 g of dichloromethane in order are added thereto, separating an organic layer. The organic layer is twice cleaned with a $NH_4Cl$ aqueous solution, three times with a 5% $Na_2CO_3$ solution, and twice with saturated saline water and then, dried with sodium sulfate to evaporated the solvents therein. The remaining product is purified through a column of ethyl acetate/hexane=2/1, obtaining 0.79 g of white crystal, preparing a compound represented by the following Chemical Formula 15.

[Chemical Formula 15]

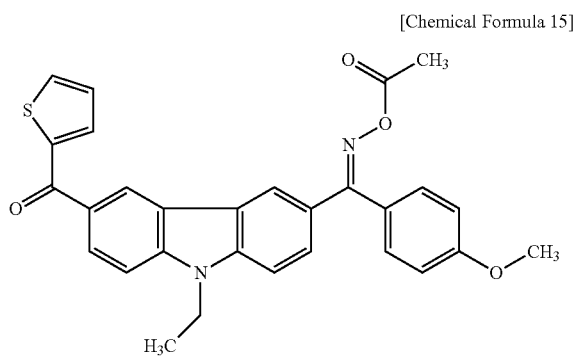 [SMILES: CCn1c2ccc(C(=O)c3cccs3)cc2c2cc(/C(=N/OC(C)=O)c3ccc(OC)cc3)ccc21]

Preparation Example 4

A cardo-based resin represented by the following Chemical Formula 16 is prepared according to the same method as Preparation Example 3 except for using 5-methyl nicotinoyl chloride instead of 2-thiopheneacetylchloride in Preparation Example 3.

[Chemical Formula 16]

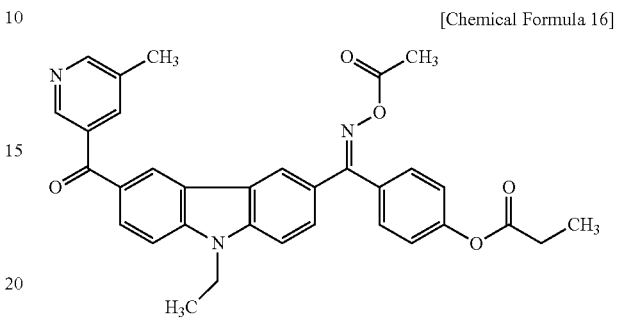

(Preparation of Photosensitive Resin Composition for Color Filter)

A photosensitive resin composition for a color filter is prepared using the following components.

(A) Binder Resin (A-1) The cardo-based resin according to Preparation Example 1 is used.

(A-2) The cardo-based resin according to Preparation Example 2 is used.

(A-3) A cardo-based resin, V259M, (Nippon Steel Chemical Co., Ltd.) is used.

(B) Photopolymerization Initiator (B-1) The compound according to Preparation Example 3 is used.

(B-2) The compound according to Preparation Example 4 is used.

(B-3) OXE02 made by BASF Co. is used.

(C) A Photopolymerizable Monomer

Dipentaerythritolhexaacrylate is used.

(D) Colorant (D-1) A mill base (Mikuni Co.) including an OBP55 black organic pigment (BASF Co.) is used.

(D-2) A carbon black dispersion, BK3877 (Tokushiki Co. Ltd.), is used.

(E) Solvent

Propylene glycol monomethylether acetate is used.

Examples 1 to 4 and Comparative Examples 1 and 2

Each photosensitive resin composition for a color filter according to Examples 1 to 4 and Comparative Examples 1 and 2 is prepared by mixing each component according to the compositions in the following Table 1. Specifically, a thermal curing initiator and a photopolymerization initiator are dissolved in a solvent, and the solution is sufficiently agitated at room temperature for 30 minutes. Next, a binder resin and a photopolymerizable monomer are added to the agitated solution. The mixture is further agitated for one hour. Then, an additive and a colorant are added to the agitated mixture. The resulting mixture is further agitated for about 2 hours. The solution is three times filtered to remove impurities, preparing a photosensitive resin composition for a color filter.

TABLE 1

| | | (wt %) | | | | | |
|---|---|---|---|---|---|---|---|
| | | Examples | | | | Comparative Examples | |
| | | 1 | 2 | 3 | 4 | 1 | 2 |
| (A) binder resin | A-1 | 4.1 | — | 4.1 | — | 4.1 | — |
| | A-2 | — | 4.1 | — | 4.1 | — | — |
| | A-3 | — | — | — | — | — | 4.1 |
| (B) photopolymerization initiator | B-1 | 0.5 | 0.5 | — | — | — | 1.5 |
| | B-2 | — | — | 0.5 | 0.5 | — | — |
| | B-3 | — | — | — | — | 0.5 | — |
| (C) photopolymerizable monomer | | 2 | 2 | 2 | 2 | 2 | 2 |
| (D) colorant | D-1 | 20 | 20 | 20 | 20 | 20 | 20 |
| | D-2 | 6.7 | 6.7 | 6.7 | 6.7 | 6.7 | 6.7 |
| (E) solvent | | 66.7 | 66.7 | 66.7 | 66.7 | 66.7 | 66.7 |

(Pattern Formation of a Color Filter)

The photosensitive resin compositions for a color filter according to Examples 1 to 4 and Comparative Examples 1 and 2 are respectively spin-coated to be 1.0 μm thick on a clean glass substrate and dried at 90° C. on a hot plate for 2 minutes. The coated substrates are exposed to a light with an exposure dose of 40 mJ using a matrix mask pattern having a line width of 10 μm and mounting a UV filter to block a wavelength of less than or equal to 350 nm in a proximity exposer made by USHIO Inc. Then, the exposed substrates are developed by spraying a 0.04% KOH aqueous solution with a spray pressure of 1.0 kg/cm$^2$ for 60 seconds after stabilizing the 0.04% KOH aqueous solution to be at 23° C., obtaining a matrix pattern having a line width of 10 μm.

Evaluation 1: Pattern Peeling Capability

The number of perfectly-remaining matrix patterns out of 100 matrix patterns with a line width of 10 μm is examined with a microscope. The residual rate is calculated and provided in the following Table 2.

Residual rate (%)=(the number of perfectly-remaining matrix patterns/100)×100

<Pattern residual rate evaluation reference>

⊚: residual rate of 100%
○: residual rate of greater than 90% to less than 100%
 : residual rate of greater than 50% to less than or equal to 90%
X: residual rate of less than or equal to 50%

Evaluation 2: Pattern-Forming Capability

The photosensitive resin compositions for a color filter according to Examples 1 to 4 and Comparative Examples 1 and 2 are respectively coated on a glass substrate and dried at 90° C. for 2.5 minutes, forming films thereon. The films are exposed with an exposure dose of 80 mJ/cm$^2$ by using a pattern mask and radiating a light having a wavelength of 365 nm. Then, the exposed films are developed with an aqueous solution (a developing solution) including 1 wt % potassium hydroxide diluted at 23° C. and then, cleaned with pure water for 1 minute. The cleaning process removes an unnecessary part and left a pattern on the substrates. The patterned substrates are heated and cured in an oven at 230° C. for 30 minutes, obtaining final patterns. The 1.0 um-high patterns are evaluated with the naked eye using an optical microscope. The results are provided in the following Table 2.

<Pattern-forming capability evaluation reference>

⊚: Excellent pattern-forming capability
○: Good pattern-forming capability
 : Bad pattern-forming capability
X: No pattern Evaluation 3: Minimum Pattern-Forming Capability The patterns according to Evaluation 2 are measured regarding line width of a minimum pattern. The results are provided in the following Table 2.

Evaluation 4: Heat Resistance

The patterns according to Evaluation 2 are additionally three times heated at 230° C. for 30 minutes in an oven and then, measured for optical density five times per one sample using an X-LITE equipment. Their averages are provided in the following Table 2.

<Heat resistance evaluation reference>

⊚: within ±1.0% related to initial optical density
○: within ±3.0% related to initial optical density
 : within ±5.0% related to initial optical density
X: within ±7.0% related to initial optical density Evaluation 5: Chemical Resistance The patterns according Evaluation 2 are measured for optical density change after dipping in a 5% hydrochloric acid aqueous solution, a 5% sodium hydroxide aqueous solution, N-methylpyrrolidone (NMP), and isopropylalcohol (IPA) for 30 minutes and dried.

<Chemical resistance evaluation reference>

⊚: within ±1.0% related to initial optical density
○: within ±3.0% related to initial optical density
 : within ±5.0% related to initial optical density
X: within ±7.0% related to initial optical density

TABLE 2

| | Pattern peeling capability | Pattern-forming capability | Line width of minimum pattern (μm) | Heat resistance | Chemical resistance |
|---|---|---|---|---|---|
| Example 1 | ○ | ⊚ | 7 | ⊚ | ⊚ |
| Example 2 | ○ | ⊚ | 9 | ○ | ○ |
| Example 3 | | ⊚ | 5 | ⊚ | ⊚ |
| Example 4 | | ○ | 7 | ⊚ | ⊚ |
| Comparative Example 1 | X | ○ | 10 | ○ | ○ |
| Comparative Example 2 | X | | 20 | | |

Referring to Table 2, the photosensitive resin compositions including a cardo-based resin and a photopolymerization initiator according to Examples 1 to 4 have excellent heat and chemical resistance as well as excellent pattern-forming capability without peeling-off or breaking compared with the ones according to Comparative Examples 1 and 2.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising (A) a binder resin including a cardo-based resin represented by the following Chemical Formula 1;

(B) a photopolymerization initiator represented by the following Chemical Formula 14;

(C) a photopolymerizable monomer;

(E) a colorant; and (F) a solvent

[Chemical Formula 1]

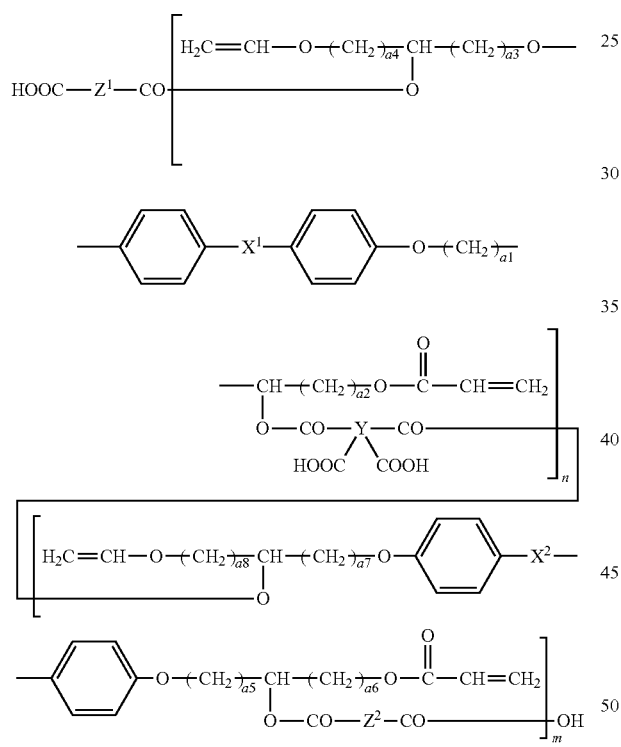

wherein, in Chemical Formula 1, $X^1$ and $X^2$ are the same or different and are each independently a single bond, substituted or unsubstituted C1 to C10 alkylene, —O—, —CO—, —COO—, —SO$_2$—, or a linking group represented by one of the following Chemical Formulae 2 to 13, Y is an acid dianhydride residual group, $Z^1$ and $Z^2$ are the same or different and are each independently an acid anhydride residual group, $a^1$ to $a^8$ are the same or different and are each independently integers ranging from 0 to 10, n is an integer ranging from 0 to 20, m is 0 or 1, and n+m≥1,

[Chemical Formula 2]

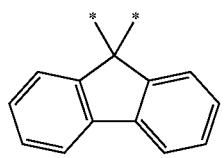

[Chemical Formula 3]

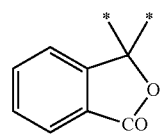

[Chemical Formula 4]

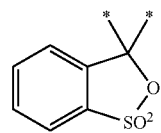

[Chemical Formula 53]

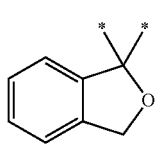

[Chemical Formula 6]

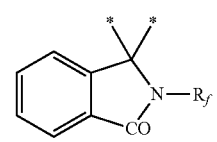

[Chemical Formula 7]

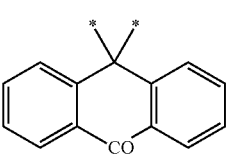

[Chemical Formula 8]

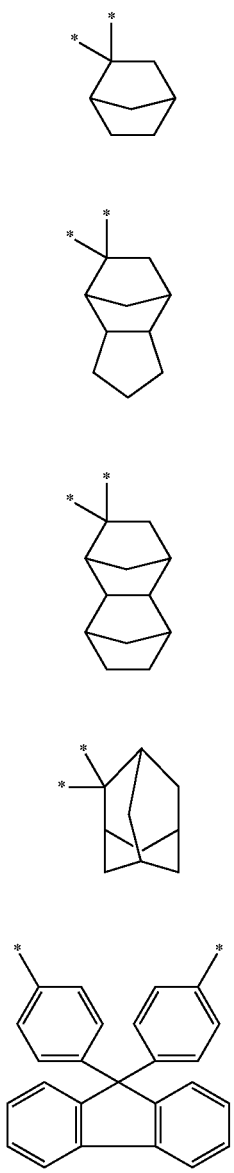

[Chemical Formula 9]

[Chemical Formula 10]

[Chemical Formula 11]

[Chemical Formula 12]

[Chemical Formula 13]

wherein, in Chemical Formula 6,
$R_f$ is hydrogen, ethyl, —$C_2H_4Cl$, —$C_2H_4OH$, —$CH_2CH=CH_2$, or phenyl,

[Chemical Formula 14]

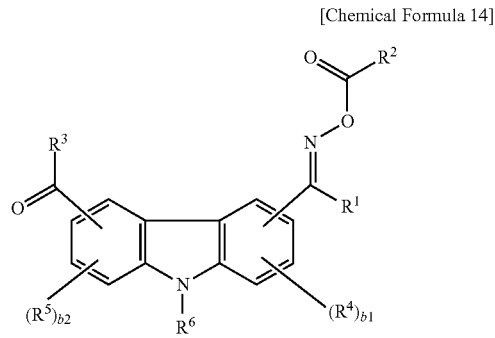

wherein, in Chemical Formula 14,
$R^1$ is substituted or unsubstituted C6 to C30 aryl, substituted or unsubstituted C6 to C30 oxyaryl, substituted or unsubstituted C1 to C20 alkyl, substituted or unsubstituted C1 to C20 oxyalkyl, substituted or unsubstituted C1 to C30 alkylaryl, or substituted or unsubstituted C1 to C30 arylalkyl, $R^2$, $R^4$, $R^5$ and $R^6$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $R^3$ is substituted or unsubstituted C6 to C30 aryl, substituted or unsubstituted C2 to C30 heteroaryl, substituted or unsubstituted C2 to C20 heterocycloalkyl, substituted or unsubstituted C2 to C20 heterocycloalkenyl, or substituted or unsubstituted C2 to C20 heterocycloalkynyl, and $b^1$ and $b^2$ are the same or different and are each independently integers ranging from 0 to 3.

2. The photosensitive resin composition for a color filter of claim 1, wherein in Chemical Formula 14, $R^1$ is substituted or unsubstituted C6 to C30 oxyaryl or substituted or unsubstituted C1 to C20 oxyalkyl.

3. The photosensitive resin composition for a color filter of claim 1, wherein in Chemical Formula 14, $R^3$ is substituted or unsubstituted C6 to C12 aryl or substituted or unsubstituted C2 to C5 heteroaryl.

4. The photosensitive resin composition for a color filter of claim 1, comprising the binder resin in an amount of about 5 to about 50 wt % based on the total weight of the photosensitive resin composition for a color filter.

5. The photosensitive resin composition for a color filter of claim 1, comprising the photopolymerization initiator in an amount of about 0.1 to about 10 wt % based on the total weight of the photosensitive resin composition for a color filter.

6. The photosensitive resin composition for a color filter of claim 1, wherein the colorant comprises a dye, a pigment, or a combination thereof.

7. The photosensitive resin composition for a color filter of claim 6, wherein the pigment comprises an organic pigment, an inorganic pigment, or a combination thereof,
the organic pigment comprises a black organic pigment, and
the inorganic pigment comprises carbon black, chromium oxide, iron oxide, titan black, titanium carbide, aniline black, or a combination thereof.

8. The photosensitive resin composition for a color filter of claim 1, wherein the photosensitive resin composition for a color filter comprises:
about 5 to about 50 wt % of the binder resin (A);
about 0.1 to about 10 wt % of the photopolymerization initiator (B);
about 1 to about 50 wt % of the photopolymerizable monomer (C);
about 1 to about 50 wt % of the colorant (D); and
a balance amount of the solvent (E).

9. A color filter manufactured using the photosensitive resin composition for a color filter of claim 1.

* * * * *

UNITED STATES PATENT AND TRADEMARK OFFICE
CERTIFICATE OF CORRECTION

| | | |
|---|---|---|
| PATENT NO. | : 8,758,654 B1 | Page 1 of 2 |
| APPLICATION NO. | : 13/913546 | |
| DATED | : June 24, 2014 | |
| INVENTOR(S) | : Kiyoshi Uchikawa | |

It is certified that error appears in the above-identified patent and that said Letters Patent is hereby corrected as shown below:

On the Title Page

Insert

--(65)  Prior Publication Data
US 2014/0166947   June 19, 2014--

In the Specification

Column 21, Line 48 reads: ": residual rate of greater than 50% to less than or equal to 90%" and should read "Δ: residual rate of greater than 50% to less than or equal to 90%"

Column 22, Line 5 reads: ": Bad pattern-forming capability" and should read:
"Δ: Bad pattern-forming capability"

Column 22, Line 24 reads: ": within ±5.0% related to initial optical density" and should read:
"Δ: within ±5.0% related to initial optical density"

Column 22, Line 38 reads: ": within ±5.0% related to initial optical density" and should read:
"Δ: within ±5.0% related to initial optical density"

Signed and Sealed this
Twenty-eighth Day of October, 2014

Michelle K. Lee
*Deputy Director of the United States Patent and Trademark Office*

Column 22, Line 43-55, Table 2 is depicted as:

|  | Pattern peeling capability | Pattern-forming capability | Line width of minimum pattern (μm) | Heat resistance | Chemical resistance |
|---|---|---|---|---|---|
| Example 1 | ○ | ◎ | 7 | ◎ | ◎ |
| Example 2 | ○ | ◎ | 9 | ○ | ○ |
| Example 3 |  | ◎ | 5 | ◎ | ◎ |
| Example 4 |  | ○ | 7 | ◎ | ◎ |
| Comparative Example 1 | × | ○ | 10 | ○ | ○ |
| Comparative Example 2 | × |  | 20 |  |  | and should be depicted as:

|  | Pattern peeling capability | Pattern-forming capability | Line width of minimum pattern (μm) | Heat resistance | Chemical resistance |
|---|---|---|---|---|---|
| Example 1 | ○ | ◎ | 7 | ◎ | ◎ |
| Example 2 | ○ | ◎ | 9 | ○ | ○ |
| Example 3 | △ | ◎ | 5 | ◎ | ◎ |
| Example 4 | △ | ○ | 7 | ◎ | ◎ |
| Comparative Example 1 | × | ○ | 10 | ○ | ○ |
| Comparative Example 2 | × | △ | 20 | △ | △ |